US008259462B2

(12) United States Patent
Hsu et al.

(10) Patent No.: US 8,259,462 B2
(45) Date of Patent: Sep. 4, 2012

(54) ELECTRICAL CONNECTOR ASSEMBLY WITH LOW PROFILE

(75) Inventors: Shuo-Hsiu Hsu, Tu-Cheng (TW); Nan-Hung Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 290 days.

(21) Appl. No.: 12/632,847

(22) Filed: Dec. 8, 2009

(65) Prior Publication Data

US 2010/0144166 A1 Jun. 10, 2010

(51) Int. Cl.
*H05K 7/02* (2006.01)

(52) U.S. Cl. .......... 361/767; 361/776; 361/785; 439/66; 439/71; 439/73

(58) Field of Classification Search .................. 361/767, 361/776, 785; 439/66, 71, 73
See application file for complete search history.

(56) References Cited

U.S. PATENT DOCUMENTS 3,900,239 A * 8/1975 Anhalt et al. .................. 439/73
5,528,462 A * 6/1996 Pendse .......................... 361/767
5,905,638 A * 5/1999 MacDonald, Jr. et al. .... 361/769
6,016,254 A * 1/2000 Pfaff ............................ 361/769
6,749,441 B1 * 6/2004 Ma ................................ 439/66
6,958,616 B1 * 10/2005 Mahoney et al. ........ 324/755.05
7,161,238 B2 * 1/2007 Hsieh et al. .................. 257/704
7,316,573 B2 * 1/2008 Xie et al. ........................ 439/66
7,322,830 B2 * 1/2008 Szu ................................ 439/66
7,578,678 B2 * 8/2009 Xie et al. ........................ 439/71
7,635,268 B2 * 12/2009 Nikaido et al. ................ 439/66
2008/0032521 A1 * 2/2008 Nikaido et al. ................ 439/73

FOREIGN PATENT DOCUMENTS

CN 2702484 5/2005
CN 201112891 8/2008

* cited by examiner

*Primary Examiner* — Dameon Levi
(74) *Attorney, Agent, or Firm* — Ming Chieh Chang; Wei Te Chung; Andrew C. Cheng

(57) ABSTRACT

An electrical connector assembly (100) includes an insulative housing (2), a micro chip (1) arranged on the insulative housing, a PCB (3) located below the insulative housing, a number of contacts (5) received in the insulative housing and a locking element (4) interconnecting the insulative housing onto the PCB. The contacts extend beyond an upper surface of the insulative housing and solder with the micro chip. The contacts extend below a lower surface of the insulative housing and contact with the PCB.

5 Claims, 2 Drawing Sheets

ELECTRICAL CONNECTOR ASSEMBLY WITH LOW PROFILE

BACKGROUND OF THE INVENTION

1. Field of the Invention

The present invention relates generally to an electrical connector assembly, and more particularly to an electrical connector assembly with low profile.

2. Description of Related Arts

A socket connector is widely used in a computer for connecting with a CPU (Central Processing Unit) and a PCB (Printed Circuit Board). Such socket connector usually includes an insulative housing and a plurality of electrical contacts received in the insulative housing. The CPU is placed on the insulative housing and the electrical contacts are land grid arranged with respect to the CPU. The connection between the CPU and the electrical contacts is not so reliable that a metal cover is usually included therein for pressing against the CPU. Usually, a pivotal lever is assembled on the insulative housing and rotates to drive the metal cover to a closed position where the CPU and the PCB are electrically connected. Because the metal cover is in presence, the socket connector has a high profile which does not meet with requirement for miniaturization.

Hence, an electrical connector assembly with low profile for connecting with a PCB is desired.

SUMMARY OF THE INVENTION

Accordingly, an object of the present invention is to provide an electrical connector assembly with low profile for connecting with a PCB.

To achieve the above object, an electrical connector assembly includes an insulative housing, a micro chip arranged on the insulative housing, a PCB located below the insulative housing, a number of contacts received in the insulative housing and a locking element interconnecting the insulative housing onto the PCB. The contacts extend beyond an upper surface of the insulative housing and solder with the micro chip. The contacts extend below a lower surface of the insulative housing and contact with the PCB.

Other objects, advantages and novel features of the invention will become more apparent from the following detailed description when taken in conjunction with the accompanying drawings.

DETAILED DESCRIPTION OF THE PREFERRED EMBODIMENT

Figure 1:
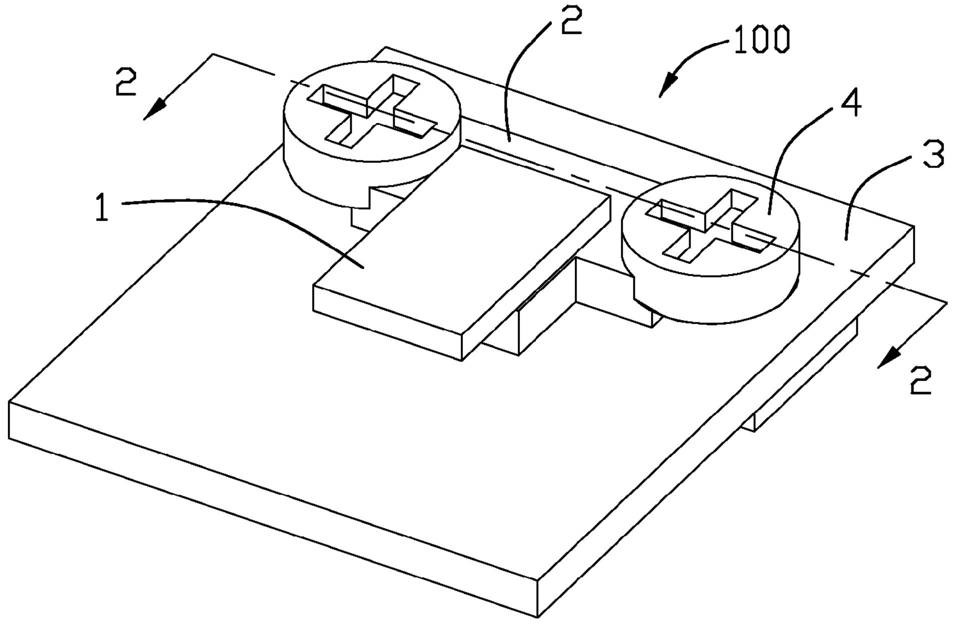
FIG. 1 is a perspective, assembled view of an electrical connector assembly constructed in accordance with the present invention.
Figure 2:
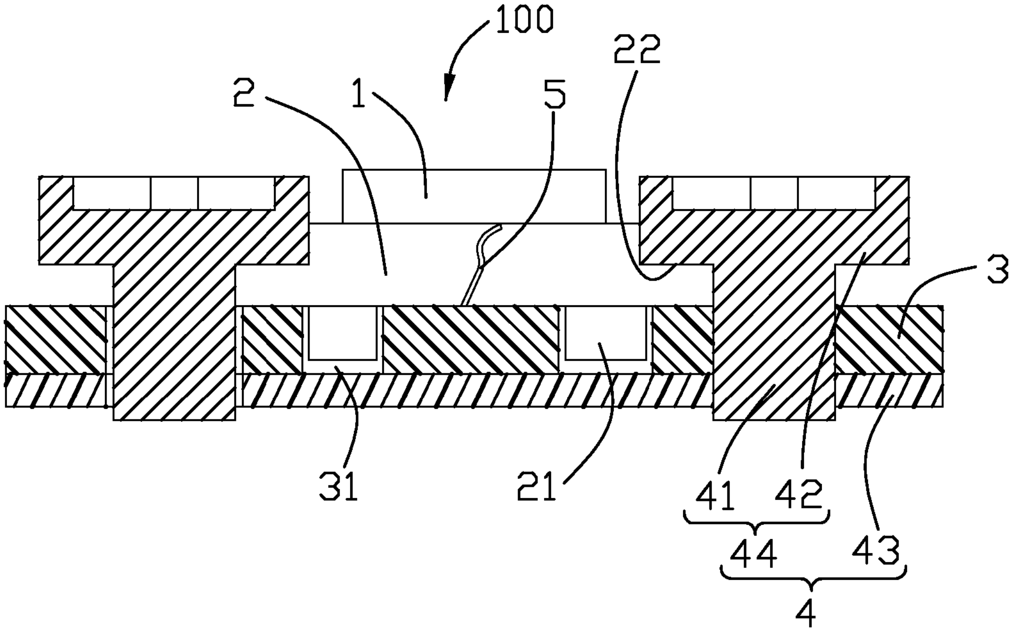
FIG. 2 is a cross-section view of the electrical connector assembly taken along line 2-2 of FIG. 1.

Referring to FIGS. 1-2, an electrical connector assembly 100 of the present invention, used for connecting a micro chip 1 with a PCB (printed circuit board) 3, includes an insulative housing 2, a plurality of contacts 5 (only one being schematically shown) received in the insulative housing 2, and a locking element 4 fastening the insulative housing 2 onto the PCB 3.

Referring to FIG. 2, the contacts 5 extend beyond an upper surface (not labeled) of the insulative housing 2 to be soldered with the micro chip 1 and extend below a lower surface (not labeled) of the insulative housing 2 to contact with the PCB 3 in an LGA (land grid array) manner. The connection manner between the contacts 5 and the micro chip 1, and the connection manner between the contacts 5 and the PCB 3 are not meant to be limiting. Other means providing mechanical and electrical connection between the contacts 5 and the micro chip 1 and other means permitting electrical connection between the contacts 5 and the PCB 3 are contemplated.

Referring to FIG. 2, the insulative housing 2 comprises a pair of stepped portions 22 at opposite sides thereof for cooperating with the locking element 4 and at least one post portion 21 extending from a lower side thereof for positioning in the PCB 3.

Referring to FIGS. 1-2, the locking element 4 comprises at least two screwing elements 44 in the present embodiment and a coupling plate 43 engaged with the screwing element 44. The coupling plate 43 is approximately rectangular shaped. Each screwing element 44 comprises a cap portion 42 and a shaft portion 41 extending from the cap portion 42.

Referring to FIGS. 1-2, the PCB 3 defines at least one cutout 31. The at least one cutout 31 receives the at least one post portion 21 for positioning the insulative housing 2 in the PCB 3. The PCB 3 further defines a pair of holes (not labeled) on outer sides of the at least one cutout 31. In a preferred embodiment, the holes are symmetrical with respect to the at least one cutout 31. The screwing element 44 is screwed into the hole from an upper side of the PCB 3 while the coupling plate 43 is attached to a lower side of the PCB 3. Each cap portion 41 engages with the stepped portion 22 and the cap portion 41 does not extend as high as the micro chip 1 arranged on the insulative housing, i.e. the micro chip 1 defines a highest profile of the electrical connector assembly 100. Each hole receives the shaft portion 41 of the screwing element 44. Therefore, the insulative housing 2 is interconnected with the PCB 3 by the locking element 4.

An assembling method for the electrical connector assembly 100 includes: providing an insulative housing 2 having a post portion 21 extending from a lower surface thereof; retaining a plurality of contacts 5 in the insulative housing 2; providing a micro chip 1 on the insulative housing 2; soldering the contacts 5 with the micro chip 1; providing a PCB 3 defining a cutout 31; positioning the post portion 21 of the insulative housing 2 in the cutout 31; and providing a locking element 4 fastening the insulative housing 2 onto the PCB 3.

The contacts 5 of the present invention are soldered with the micro chip 1 so as to establish a reliable connection therebetween. Furthermore, a metal cover as is required in the prior art is avoided herein for reducing a height of the whole electrical connector assembly 100. On the other hand, the advantage of the instant invention compared with the method of directly soldering the micro chip to the printed circuit board is that once other inexpensive components on the printed circuit board are out of work and/or thus the whole printed circuit board does not work, the relatively costly micro chip may be easily disassembled from the printed circuit board and reassembled to other workable printed circuit boards conveniently. In opposite, if the subject micro chip is out of work, it is also easy to disassemble the unworkable micro chip from the printed circuit board and replace it with another new one for the same printed circuit board.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector comprising:

a printed circuit board defining opposite upper and lower surfaces thereon; an insulative housing position upon the upper surface of the printed circuit board and defining opposite upper and lower faces thereof;

at least one contacts supportably disposed in the housing and defining opposite upper and lower ends thereof under condition that the upper end is directly permanently soldered to a micro chip set which is seated upon the housing, and a lower end which abuts against the upper surface without permanent securement therebetween, and a fastening device fastening the housing and the printed circuit board together so as to achieve electrical connection between the lower end of the contact and the printed circuit board, and, further including another fastening device spaced from said fastening device along a transverse direction while the housing essentially extends in a longitudinal direction perpendicular to said transverse direction, wherein said housing is equipped with at least one post portion extending into a corresponding through hole in the printed circuit board, said through hole downward confronts a coupling plate, in a hidden manner without downward exposure to an exterior, which is attached to the bottom surface of the printed circuit board via said fastening devices.

2. The electrical connector as claimed in claim 1, further including a coupling plate abutting against and attached to the bottom surface via said fastening device.

3. The electrical connector as claimed in claim 1, wherein said upper end is flush with the upper face of the housing.

4. The electrical connector as claimed in claim 1, wherein said lower end is flush with the lower face of the housing.

5. An electrical connector comprising:

a printed circuit board defining opposite upper and lower surfaces thereon;

an insulative housing position upon the upper surface of the printed circuit board and defining opposite upper and lower faces thereof;

at least one contacts supportably disposed in the housing and defining opposite upper and lower ends thereof under condition that the upper end abuts against a micro chip set which is seated upon the housing, and a lower end which abuts against the upper surface without permanent se-curement therebetween; and a fastening device fastening the housing and the printed circuit board together so as to achieve electrical connection between the lower end of the contact and the printed circuit board; wherein said housing is equipped with at least one post portion extending into a corresponding through hole in the printed circuit board, said through hole downward confronts a coupling plate, in a hidden manner without downward exposure to an exterior, which is attached to the bottom surface of the printed circuit board via said fastening devices.

* * * * *